(12) United States Patent
Lee et al.

(10) Patent No.: US 11,950,472 B2
(45) Date of Patent: Apr. 2, 2024

(54) FLEXIBLE DISPLAY APPARATUS INCLUDING DUMMY PATTERN BETWEEN WIRINGS

(71) Applicant: LG DISPLAY CO., LTD., Seoul (KR)

(72) Inventors: SeokYoung Lee, Daejeon (KR); JuWon Sun, Seoul (KR); JeongHwan Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/097,894

(22) Filed: Jan. 17, 2023

(65) Prior Publication Data

US 2023/0172018 A1   Jun. 1, 2023

Related U.S. Application Data

(63) Continuation of application No. 17/112,397, filed on Dec. 4, 2020, now Pat. No. 11,588,003.

(30) Foreign Application Priority Data

Dec. 12, 2019   (KR) .................. 10-2019-0165217

(51) Int. Cl.
| | | |
|---|---|---|
| H10K 50/84 | (2023.01) | |
| H10K 50/844 | (2023.01) | |
| H10K 59/13 | (2023.01) | |
| H10K 59/131 | (2023.01) | |
| H10K 59/40 | (2023.01) | |
| H10K 59/88 | (2023.01) | |
| G02F 1/1333 | (2006.01) | |
| G06F 1/16 | (2006.01) | |
| G09F 9/30 | (2006.01) | |
| H01L 27/146 | (2006.01) | |

(Continued)

(52) U.S. Cl.
CPC ......... *H10K 59/131* (2023.02); *H10K 50/844* (2023.02); *H10K 59/88* (2023.02); *G02F 1/133331* (2021.01); *G06F 1/1652* (2013.01); *G09F 9/301* (2013.01); *G09G 2300/0408* (2013.01); *G09G 2300/0413* (2013.01); *G09G 2300/0804* (2013.01); *G09G 2380/02* (2013.01); *H01L 27/14678* (2013.01); *H10K 50/8426* (2023.02); *H10K 50/868* (2023.02); *H10K 59/40* (2023.02); *H10K 77/111* (2023.02); *H10K 2102/311* (2023.02)

(58) Field of Classification Search
CPC ............... H10K 50/844; H10K 50/868; H10K 50/8426; H10K 59/131; H10K 59/88; H10K 59/40; H10K 77/111; H10K 2102/311; H01L 27/14278; G02F 1/133331; G02F 1/1652; G09F 9/301; G09G 2300/0408; G09G 2300/0804; G09G 2300/0413; G09G 2380/02
See application file for complete search history.

(56) References Cited

U.S. PATENT DOCUMENTS

| | | | |
|---|---|---|---|
| 9,287,329 B1 * | 3/2016 | Lee ..................... | H10K 50/8426 |
| 10,302,980 B2 * | 5/2019 | Tomioka .............. | H10K 50/828 |

(Continued)

FOREIGN PATENT DOCUMENTS

| | | | | |
|---|---|---|---|---|
| KR | 20190052327 A | * | 5/2019 | ......... H10K 59/1213 |

*Primary Examiner* — Ida M Soward
(74) *Attorney, Agent, or Firm* — POLSINELLI PC

(57) ABSTRACT

A flexible display apparatus includes a flexible substrate having an active area and an inactive area, the inactive area including a first area adjacent to the active area, a second area in which a pad is disposed, and a bending area disposed between the first area and the second area, wherein a plurality of wirings extending from the second area to the first area are disposed in the bending area, and at least one dummy pattern is in between the plurality of wirings.

20 Claims, 7 Drawing Sheets

(51) Int. Cl.
*H10K 50/80* (2023.01)
*H10K 50/842* (2023.01)
*H10K 77/10* (2023.01)
*H10K 102/00* (2023.01)

(56) References Cited

U.S. PATENT DOCUMENTS

| | | |
|---|---|---|
| 2006/0131064 A1 | 6/2006 | Hagiwara |
| 2008/0036042 A1 | 2/2008 | Sano et al. |
| 2013/0222326 A1 | 8/2013 | Cok |
| 2015/0187279 A1* | 7/2015 | Lee ................ H10K 59/805 438/23 |
| 2015/0382446 A1* | 12/2015 | Kwon ............... G06F 1/1643 174/251 |
| 2016/0172428 A1* | 6/2016 | Song ................ H10K 59/131 257/40 |
| 2017/0287937 A1* | 10/2017 | Ka ................. H01L 27/1244 |
| 2018/0040672 A1 | 2/2018 | Park et al. |
| 2018/0097044 A1 | 4/2018 | Choi |
| 2018/0120997 A1 | 5/2018 | Moon et al. |
| 2018/0301520 A1 | 10/2018 | Jin et al. |
| 2019/0006442 A1* | 1/2019 | Byun ............... H10K 59/124 |
| 2020/0089351 A1* | 3/2020 | Jeong .............. G06F 3/044 |
| 2020/0136066 A1* | 4/2020 | Jin ................. H10K 59/40 |
| 2020/0203641 A1* | 6/2020 | Lee ................ G02F 1/136286 |
| 2021/0333942 A1 | 10/2021 | Zhang et al. |

\* cited by examiner

FLEXIBLE DISPLAY APPARATUS INCLUDING DUMMY PATTERN BETWEEN WIRINGS

CROSS-REFERENCE TO RELATED APPLICATIONS

This application is a continuation of U.S. patent application Ser. No. 17/112,397, filed on Dec. 4, 2020, which claims priority from Korean Patent Application No. 10-2019-0165217, filed on Dec. 12, 2019, which are hereby incorporated by reference in their entirety for all purposes as if fully set forth herein.

BACKGROUND

Field of the Disclosure

The present disclosure relates to a flexible display apparatus, and more particularly, to a flexible display apparatus having a bendable display panel.

Description of the Background

Along with the recent advent of the information age, the display technology for expressing electrical information signals into visual images has rapidly developed. Consequently, a variety of display apparatuses with excellent performance in effecting thinner design, weight lightening, and lower-power consumption are currently under development.

Specific examples of such a display apparatus may include a liquid crystal display apparatus (LCD), an organic light emitting display apparatus (OLED), a quantum dot display apparatus and so on.

This display apparatus may include a display panel and a number of components for providing various functions. For example, one or more display driving circuits for controlling the display panel may be included in a display assembly. Examples of driving circuits may include gate drivers, light emitting (source) drivers, power (VDD) routing, electrostatic discharge (ESD) circuits, multiplex (MUX) circuits, data signal lines, cathode contacts, and other functional elements. A plurality of peripheral circuits for providing various types of additional functions, such as, for example, touch sensing or fingerprint identification or other functions, may be included in the display assembly. Some components may be disposed on the display panel itself, or on some areas adjacent to the display area, which is a non-display area and/or an inactive or non-active area.

The dimension and weight of a display apparatus may be one of the most important issues when designing such a display apparatus. Further, a high ratio of the size of the active area to the size of the inactive area, typically referred to as a screen-to-bezel ratio, may be one of the main characteristics in the state of the art. However, arranging some of the aforementioned components in one display assembly may require a large inactive area, which may often add up to much part of the display panel. The larger inactive area generally tends to make the display panel larger, which typically makes it difficult to integrate the display panel into a housing of the display apparatus. The larger inactive area may require a larger masking (e.g., bezel edge, covering material, etc.) to cover a large portion of the display panel, and in some cases, it may lead to a problem that disadvantageously affects the aesthetic feelings of the display apparatus.

Some components may be disposed on a separate flexible printed circuit board (FPCB) and/or may be located on the backplane of the display panel. However, notwithstanding this configuration, interfaces for connecting wirings between the FPCB and any active area or those components necessary for driving a display panel such as a driver IC are still disposed in the inactive region, which may result in a limitation in reducing the bezel dimension.

SUMMARY

The inventors of the present disclosure have recognized that a variety of high technologies such as, for example, the location of the wiring, the width of the wiring, and a signal transmission scheme are required to implement a narrow bezel with a reduced size of inactive area. Accordingly, the inventors of the present disclosure have carried out various studies utilizing the bending characteristics of a display apparatus to which a flexible substrate is applied. Through those several studies, the inventors have devised a novel structure and a manufacturing method for minimizing a non-display area, for example, an inactive area, which is not an active area where images are displayed.

For example, the proportion of the active area can be increased by bending part of the display panel, in order to make the display apparatus smaller and lighter by lowering the proportion of the inactive area. This allows some inactive area to be located behind the active area of the display panel, and thus, it can reduces or eliminates the inactive area that has to be hidden beneath a masking or a housing of the display apparatus. Such bending of the display panel provide a flexible display apparatus capable of minimizing the dimension of an inactive area to be concealed from the field of view, realizing a narrow bezel or a bezel-free display apparatus, and improving aesthetic feeling.

However, there have been yet new challenges to be solved when providing such flexible display panels.

For bending of the flexible substrate, polyimide was used for the substrate, and a wiring was then formed without a separate inorganic insulating film in the to-be-bended area to prevent occurrence of cracking. In case where such a separate inorganic insulating film is formed beneath the wiring of the to-be-bended area, the bended area are often subject to various mechanical stresses and environmental stresses that may occur during its manufacturing stage and/or in its using after completion of the product. The stress generated due to the characteristic hard properties of the inorganic insulating film may break the inorganic insulating film. In particular, the mechanical stress from the bending process of the flexible display panel may tend to disadvantageously affect the reliability of the product or, furthermore, cause failure of the finished components. For example, wiring-related components such as a high-potential voltage (VDD) wiring, a low-potential voltage (VSS) wiring, and data signal lines that extend from the inactive area and then formed in the to-be-bended area have been designed to minimize the cracks that may occur in the inorganic insulating film, by forming them without any inorganic insulating film between the components and the flexible substrate. An interaction of chlorine gas (Cl) used when performing dry etching to form a wiring in the bending region, and the residual films existing on the substrate may cause reaction with the wiring to generate oxidation. This oxidation may grow gradually over time to become a so-called dark spot, and often generate cracks or shorts in the wiring to cause some quality problems. Hereinafter, for the sake of convenience, such a to-be-bonded area of the flexible substrate will be referred to as a "bending area" or a "bending section".

Therefore, it will be a key point in realizing such a narrow bezel or bezel-free display apparatus to design the bending area so as not to undergo oxidation of its wiring, without reinforcing by additional fixtures, to prevent disconnection or short-circuit of the wiring, thereby ensuring not to go against the prevailing development trends for the state of the art flexible display apparatus, that is, the lighter weight and thinner dimension.

A display apparatus according to aspects of the present disclosure comprises a flexible substrate having an active area and an inactive area, the inactive area including a first area adjacent to the active area, a second area in which a pad is disposed, and a bending area disposed between the first area and the second area, wherein a plurality of wirings extending from the second area to the first area may be disposed in the bending area, and a dummy pattern may be in between the plurality of wirings.

A display apparatus according to aspects of the present disclosure comprises a substrate having a display area and a non-display area, the non-display area including a first area, a second area and a bending area disposed between the first area and the second area, the bending area including a plurality of first wirings extending to the first area and the second area, and a dummy pattern extending in the same direction as the first wiring between the plurality of first wirings.

Details of other aspects are included in the detailed description and drawings as disclosed herein.

A display apparatus according to the exemplary aspects of the present disclosure is possible to provide a display apparatus with a slim bezel or narrow bezel in an overall appearance of a display panel, by applying a flexible substrate to fold all or part of an inactive area, which is a non-display area of the display panel, in a form having a certain radius of curvature, and arranging it on the rear surface of the active area.

Therefore, a user of this display apparatus can enjoy a device aesthetically full of the light emitting screen on the entire front surface of the display apparatus, and the display apparatus can render the user experiencing better feeling of grip and lighter weight, by using a compact module applied to a narrow bezel functionally.

The display apparatus according to the exemplary aspect of the present disclosure may be configured to dispose a dummy pattern between the wirings to prevent oxidation of the various wirings disposed on a substrate region to be bent, when all or part of the inactive region is folded into the form having a certain radius of curvature so that the distance between the substrates gets to a certain thickness. Such a dummy pattern may prevent chlorine gas (Cl gas) used in the dry etching process performed to finish the shape of the wirings from remaining in a space formed in between the wirings in the bending area. Adding the dummy pattern to the space formed in between the wirings in the bending area so that there is no room for chlorine gas to remain enables to prevent oxidation of the wirings efficiently.

The display apparatus according to the exemplary aspects of the present disclosure makes it possible to prevent increased oxidation of the wirings as the isolation distance or spacing between those wirings gets larger, by arranging a plurality of dummy patterns along the extending direction of the wirings.

The display apparatus according to the exemplary aspects of the present disclosure makes it possible to arrange the distance between the plurality of dummy patterns and adjacent wirings at regular intervals to make a control of the space where oxidation can occur.

The display apparatus according to an exemplary aspect of the present disclosure can keep constant or reduce the stress applied to neighboring wirings in the process of bending the flexible substrate by arranging the dummy patterns in a certain regular form.

The display apparatus according to the aspects of the present disclosure can improve the durability of the bending area by optimizing the arrangement of the structure disposed in the bending area to keep constant the tensile stress and the compressive stress applied to the structure.

The effects of the present disclosure are not limited only to the foregoing, and other effects not disclosed herein will be clearly understood by those skilled in the art from the following description.

All the contents as disclosed heretofore with reference to the subject matter(s) to be solved, the solution for solving the problems, and the effects of the disclosure do not specify the essential features of the claims, and the scope of the claims should not be construed to be limited by the contents of the present disclosure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain various principles of the present disclosure.

In the drawings.

DETAILED DESCRIPTION

Figure 1:
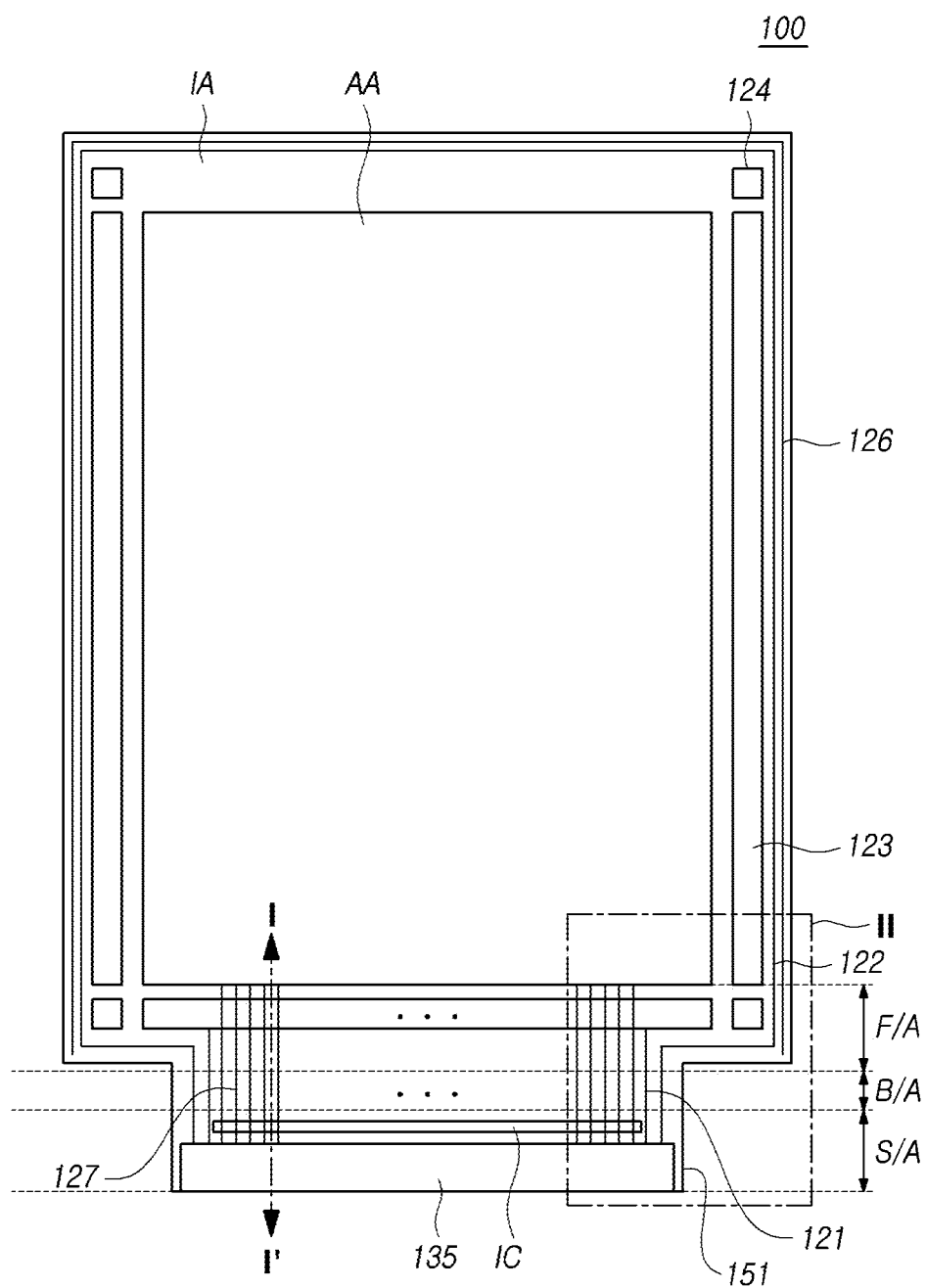
FIG. 1 shows a top view of a display panel according to an exemplary aspect of the present disclosure.

Advantages and features of the present disclosure, and methods for achieving the same may be apparent from the aspects described below with reference to the accompanying drawings. However, the present disclosure is not limited to the aspects disclosed herein, and various changes may be made thereto. The aspects disclosed herein are provided only to inform one of ordinary skilled in the art of the category of the present disclosure. The present disclosure is defined only by the appended claims.

The shapes, sizes, ratios, angles, and numbers shown in the drawings to describe aspects of the present disclosure are merely examples, and the present disclosure is not limited thereto. The same reference numeral denotes the same element throughout the specification. When determined to make the subject matter of the present disclosure unnecessarily unclear, the detailed description of the known art or functions may be skipped. The terms "comprises" and/or "comprising," "has" and/or "having," or "includes" and/or "including" when used in this specification specify the presence of stated features, regions, integers, steps, operations, elements, and/or components, but do not preclude the presence or addition of one or more other features, regions, integers, steps, operations, elements, components, and/or groups thereof. As used herein, the singular forms "a", "an" and "the" are intended to include the plural forms as well, unless the context clearly indicates otherwise.

An element is interpreted as having a margin of error unless expressly stated otherwise.

It will be understood that when an element is referred to as being positioned or located "on," "over," "under," or "next to" another element, intervening elements may be present between the two elements unless referred to as being positioned or located "directly on," "directly over," "directly under," or "directly next to" another element.

It will be understood that when an event is referred to as occurring "after," "subsequent to," "next to," or "before" another event, it may occur discontinuously from the other event unless referred to as occurring "directly after," "directly subsequent to," "directly next to," or "directly before" or "immediately after," "immediately subsequent to," "immediately next to," or "immediately before."

Although the terms "first" and "second" are used to describe various components, the components are not limited by the terms. These terms are provided simply to distinguish one component from another. Accordingly, the first component mentioned herein may also be the second component within the technical spirit of the present disclosure.

Such denotations as "first," "second," "A," "B," "(a)," and "(b)," may be used in describing the components of the present disclosure. These denotations are provided merely to distinguish a component from another, and the essence of the components is not limited by the denotations in light of order or sequence. When a component is described as "connected," "coupled," or "linked" to another component, the component may be directly connected or linked to the other component, but it should also be appreciated that other components may be "connected," "coupled," or "linked" between the components.

As used herein, the term "display apparatus" may be interpreted as encompassing liquid crystal modules (LCMs), organic light emitting diode (OLED) modules, or quantum dot (QD) modules including a display panel and a driver for driving the display panel. The term "display apparatus" may also encompass complete or final products including an LCM, OLED module, or QD module, such as laptop computers, televisions, computer monitors, automotive displays, vehicle equipment displays, smartphones, electronic pads, or other mobile electronic devices, or such set electronic devices, or set devices or apparatuses.

The term "display apparatus" may encompass LCMs, OLED modules, QD modules, or other display apparatuses or application products or consumer devices or set devices equipped with an LCM, OLED module, or QD module.

In some cases, an LCM, OLED module, or QD module including a display panel and a driver may be referred to as a "display apparatus," or an electronic device, as a complete product including an LCM, OLED module, or QD module, may be referred to as a "set device." For example, the display apparatus may include a display panel of liquid crystal display (LCD), OLED, or QD and a source printed circuit board (PCB), as a controller for driving the display panel, and the set device may further include a set PCB, as a set controller electrically connected with the source PCB to control the entire set device.

As used herein, the term "display panel" may encompass all kinds or types of display panels including LCD panels, OLED panels, QD display panels, and electroluminescent display panels and is not limited to specific display panels that have an OLED display panel flexible board and a backplay supporting structure thereunder and are bezel-bendable. The display panel used in a display apparatus according to an aspect of the disclosure is not limited to a specific shape or size.

Specifically, where the display panel is an OLED display panel, the display panel may include multiple gate lines, multiple data lines, and pixels at the intersections of the gate lines and the data lines. The display panel may include an array including a thin film transistor (TFT) to selectively apply voltage to each pixel, an OLED layer on the array, and an encapsulation substrate or layer on the array to cover the OLED layer. The encapsulation layer may protect the TFT and OLED layer from external impacts and prevent infiltration of moisture or oxygen into the OLED layer. Layers formed on the array may include, e.g., an inorganic light emitting layer, e.g., a nano-sized material layer or a QD layer.

In the present disclosure, FIG. 1 illustrates an exemplary organic electroluminescent (OLED) display panel 100 that may be incorporated into display apparatuses.

FIG. 1 shows a top view of the display panel according to an exemplary aspect of the present disclosure. Referring to FIG. 1, the organic electroluminescent display panel 100 may include at least one active area AA in which light emitting elements and an array for driving the light emitting elements are formed.

The display panel 100 may include an inactive area IA disposed in the periphery of the active area AA, wherein the top, bottom, left, and right peripheral portions out of the active area AA may be referred to as an inactive area IA. For example, in the bottom peripheral portion, the inactive area IA may include a first area F/A adjacent to the active area AA, a second area S/A in which a pad 135 is disposed, and a bending area B/A disposed between the first area F/A and the second area S/A. Although the active area AA may have a rectangular shape, various other shapes of display devices such as a circle, an ellipse, or a polygon may be applied to a smart watch, an automotive display device and so on. Therefore, the arrangement of the inactive area IA surrounding the active area AA is not limited to the organic electroluminescent (OLED) display panel 100 illustrated in FIG. 1. In the left and right inactive areas IA out of the active area AA, various components for driving the light emitting elements and arrays formed in the active area AA may be positioned to provide a function for stable light emission. For example, these components may include circuits such as gate-in-panel (GIP) 123), electrostatic discharge (ESD) 124 and other, an area for contacting between a cathode that is part of a light emitting element and a low potential voltage (VSS) wiring 122 that is a voltage reference point of the light emitting element, and a number of dam structures to prevent the overflow out of the display panel 100 during the coating process of a foreign matter compensation layer of an encapsulation layer 170 for protecting the light emitting element from external moisture or foreign substance. Further, a crack stopper structure 126 may be disposed in the inactive area, for preventing cracks from being spread into the display panel 100, which cracks may occur during the cutting process (namely, scribing process) to divide a mother substrate into some separate display panels 100.

The crack stopper structure 126 of the present disclosure can prevent growing of a dark spot or generation of pixel shrinkage, as the impact generated by the trimming line of the substrate 110 during the cutting process gets to GIP 123, ESD 124 or the low-potential voltage (VSS) wiring 122 formed in the inactive region IA to destroy the same, or it provides a moisture-permeable path to the light-emitting element or array formed in the active region AA.

The crack stopper structure 126 may be formed of an inorganic film or an organic film, and may be formed of a multilayer structure of the inorganic film and the organic film, although it is not limited thereto. Although FIG. 1 illustrates that the crack stopper structure 126 is only disposed on both the longer side and one shorter side of the display panel 100, it is not limited thereto. For example, the crack stopper structure 126 may be also disposed in the bending area BA and the area where the notch 151 is formed, so that it may be disposed on substantially the entire outer surface region of the substrate 110.

In the area adjacent to the trimming line of the substrate 110, which corresponds to the outside of the crack stopper structure 126, it is possible to etch part or the whole of the insulating films (GI, buffer layer, etc.) entirely deposited when forming the active region AA. Through such etching, a small amount of insulating film may remain on the upper portion of the substrate 110 or the upper surface of the substrate may be completely exposed, so that no impact of the cutting is transmitted to the corresponding insulating film.

Referring back to FIG. 1, an FPCB electrically connected to a pad 135 configured to receive/transmit a touch signal or to receive an external power and a data driving signal may be disposed in a lower area of the display panel 100. A wiring 121 for high potential voltage (VDD), a wiring 122 for low potential voltage (VSS), and/or a voltage wiring 127 for data extending from the FPCB may be disposed.

The voltage wiring 127 for data of the present disclosure may be disposed to be connected to a data driver Integrated Circuit IC that generates a light emission signal from the light emitting element 112.

The area where the pad 135 and the data driver integrated circuit IC as described above are disposed may be of a second component forming section. A portion of the high potential voltage wiring 121 and the low potential voltage wiring 122 may be disposed in the second component forming section.

Referring to FIG. 1, a notch 151 formed by cutting both the lower edges of the display panel 100 for bending the bending area BA, as indicated by a dotted line, may be arranged in the display panel 100 according to an aspect of the present disclosure.

For example, when performing the cutting process for dividing the mother substrate into individual display panels, some of the inactive area IA may be cut inwardly in the vicinity of both the lower edge areas of the display panel 100, which is part of the inactive area IA. Thus, the notch 151 may be formed such that the trimming line is adjacent to the wiring 121 for high-potential voltage (VDD) or the wiring 122 for low-potential voltage (VSS).

The notch 151 of the present disclosure may be disposed so that it may start at one end of the flexible substrate 110 and the bending process may be performed in the vicinity of the corresponding area. The bending process may be terminated may be adapted to end in the vicinity of the data driver integrated circuit IC 137, so that the flexible substrate area with the data driver integrated circuit IC and the FPCB pad 135 may abut onto a back side of the flexible substrate 110 on which the active area AA is formed.

The member connected to the pad 135 formed on the top surface of the display panel 100 is not limited to the FPCB, and various members can be connected, and the position of the pad 135 may be disposed on the top surface or back surface of the display panel 100 as circumstances require.

Although FIG. 1 illustrates that the data driver IC is arranged on the upper surface of the display panel 100, the arrangement is not limited to the data driver IC. Further, the location of the data driver IC is not limited to the upper surface of the display panel and it may be disposed on its back surface.

Figure 2:
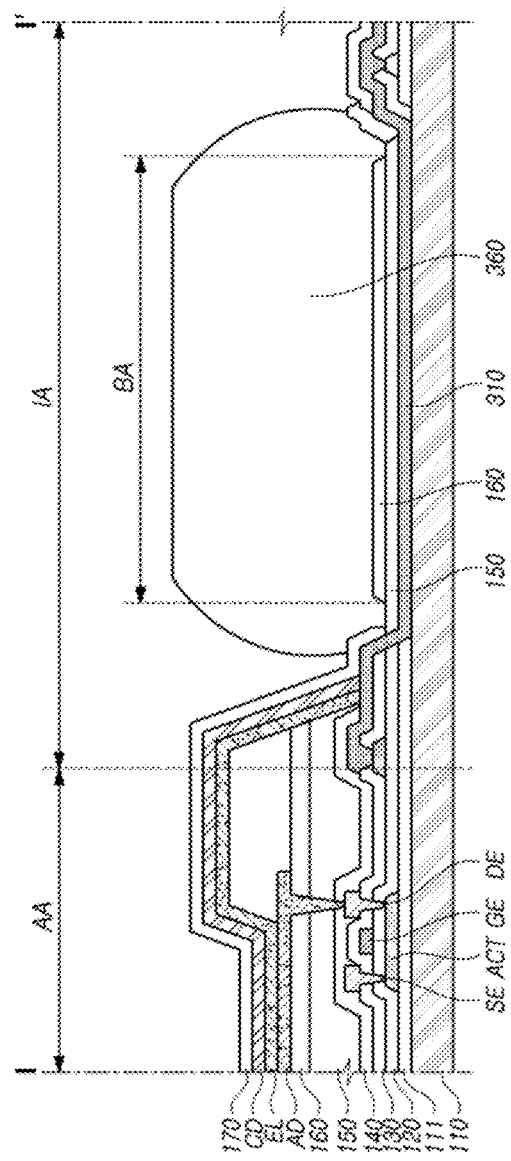
FIG. 2 shows a cross-sectional view taken along cutting line I-I' of FIG. 1.

FIG. 2 is a cross-sectional view taken along cutting line I-I' shown in FIG. 1, in order to emphasize a cross-section of a state in which the inactive area IA of the display panel 100 in FIG. 1 is bent. In FIG. 2 is illustrated the active area AA including a flexible substrate 110, and a TFT, a light emitting element and an encapsulation layer 170 that may be formed on the flexible substrate 110.

The flexible substrate 110 may be, for example, a polyimide resin-based material, although not limited thereto. A buffer layer 111 may be formed on the flexible substrate 110 and an active layer ACT may be then formed. The buffer layer 111 may have a structure in which a plurality of inorganic insulating layers such as SiNx and SiOx are stacked, but the structure is not limited thereto. The active layer ACT may be formed of low temperature polysilicon (LTPS), and a gate insulating layer 120 may be disposed on the active layer ACT. A gate layer GE may be formed on the gate insulating layer 120, which gate layer GE may be formed of molybdenum (Mo). An interlayer insulating layer 130 may be formed on the gate layer GE, and a hole may be formed through the gate insulating layer 120 and the interlayer insulating layer 130 to connect a source electrode SE and a drain electrode DE of the TFT to the active layer ACT. A first planarization layer 150 and a second planarization layer 160 may be disposed on the source electrode SE and the drain electrode DE. This planarization film may be formed of an organic film. An anode electrode AD, an organic emission layer EL for light emission, and a cathode electrode CD may be formed on the second planarization layer 160.

On the cathode electrode CD may be formed an encapsulation layer 170 to protect the organic light emitting layer EL from external moisture or foreign matter. The encapsulation layer 170 may have, for example, a three-layer structure of inorganic film/organic film/inorganic film, and the inorganic film may be of e.g., Si-based SiNx, SiOx, or SiON.

The organic film applied to the encapsulation layer 170 may be a particle capping layer (PCL), but it is not limited to such a term. The particle capping layer may be formed of a material such as e.g., epoxy resin, which is of a polymer. In case of the inorganic film, an inorganic material made up of a plurality of layers, such as e.g., SiNx/SiON, rather than a single layer, may be used.

The bending area BA may be disposed in the inactive area IA, which is an area surrounding the active area AA, and a micro coating layer 360 (MCL) may be then disposed above the substrate 110 corresponding to the bending area BA, so as to prevent various wirings disposed on the bending area BA from being cut and damaged.

The micro coating layer 360 may be disposed on various wirings such as a data wiring 127, a high potential voltage wiring 121, and a low potential voltage wiring 122 formed on the bending area BA, so that the positions of these wirings in the bending can be adjusted to get closer to the neutral line. Hence, the durability of the wirings can be further improved by allowing the tensile stress formed above the neutral line and the contraction stress formed beneath the neutral line to be applied to those wirings as small as possible. In addition, the micro coating layer 360 may also include physical and/or chemical protection functions capable of protecting various wirings 310 disposed on the flexible substrate 110 from external impact, moisture, or dust during the manufacturing process.

Figure 3:
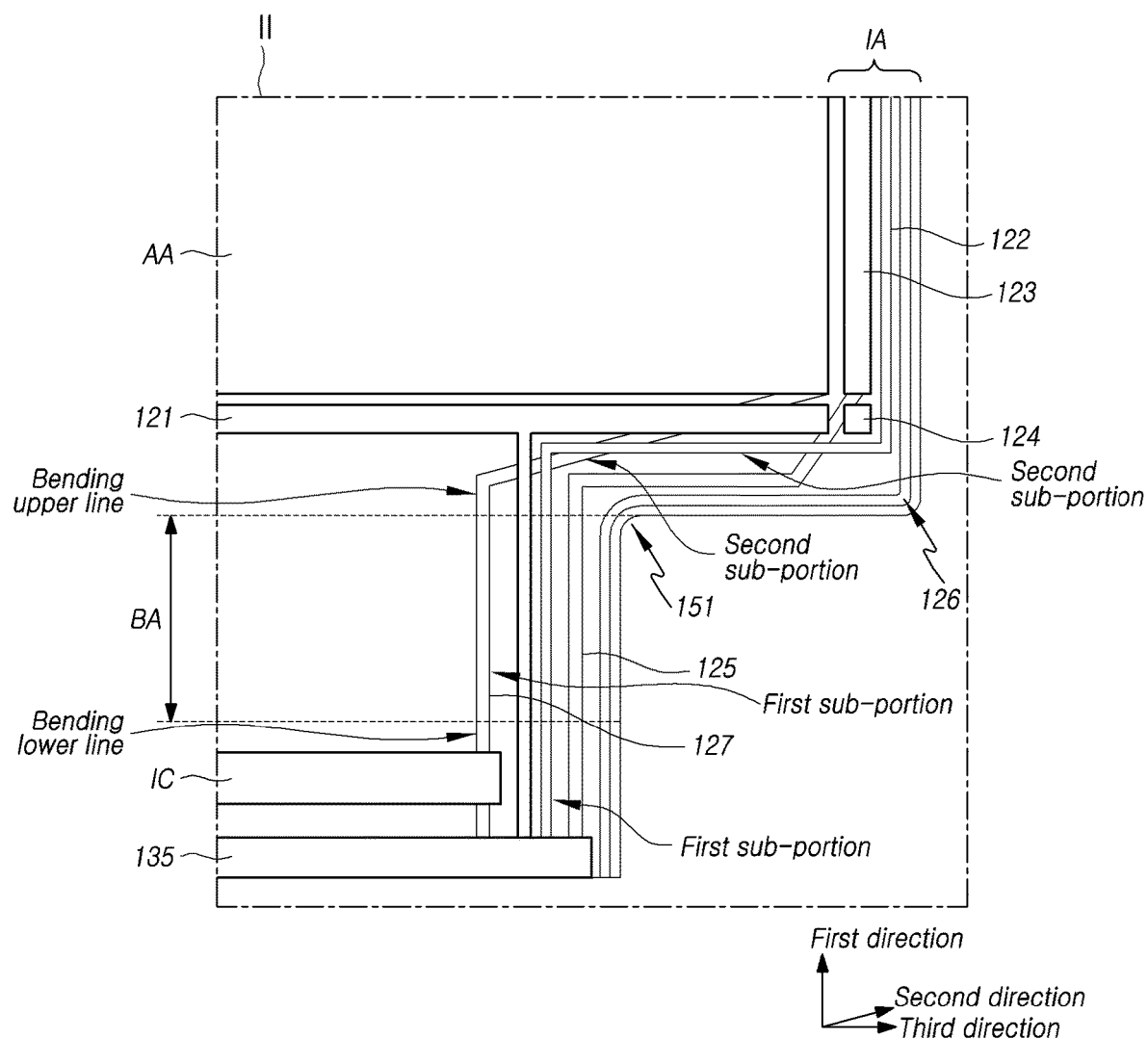
FIG. 3 shows an enlarged cross-sectional view of dotted line area II of FIG. 1.

FIG. 3 shows an enlarged view of the area where the notch 151 of FIG. 1 is disposed, showing various components in the bending area BA and the inactive area IA before performing the bending process.

The notch 151 can be made by inwardly cutting an edge of the flexible substrate 110 at a position corresponding to the bending area BA, which is folded to the back surface of the substrate 110 upon bending in the inactive area IA. The substrate cutting line as shown in FIG. 3 may be formed by a substrate cutting method using a laser. For a slim or narrow bezel, the smaller being the area of the substrate 110 to be bent when performing the bending process, the smaller becomes the stress applied to the substrate 110 in the bending, so that processability can be further improved. In addition, a crack stopper structure 126 may be formed inside the substrate 110 along the trimming line including the notch 151 to prevent propagation of cracks that may occur during the cutting process. As shown in FIG. 3, the trimming line of the substrate 110 may be formed with round corners to improve processability and durability.

The GIP 123, the ESD 124 and so on may be disposed on a side surface of the active area AA, and the low potential voltage wiring 122 for grounding may be disposed along the outer periphery. The external power input from the pad 135 may pass through the bending area BA via the high potential voltage wiring 121, the data wiring 127, and the gate power line 125, and enter the active region IA which is close to the active area AA. Further, the data wiring 127 may extend from a driver IC to pass through the bending area BA and then enter the active area AA. As shown in FIG. 3, the data wiring 127 may comprise a first sub-portion extending in a first direction and a second sub-portion extending in a second direction at a first predefined angle to the first direction, and the data wiring 127 may include, for example, a bending upper line and a bending lower line. Further, the low potential voltage wiring 122 may comprise a first sub-portion extending in the first direction and a second sub-portion extending in a third direction at a second predefined angle to the first direction. By configuring the various wirings to pass through the bending area BA, most of those wirings may be subject to the tensile stress and contraction stress during the bending process. Thus, when the bending area BA is bent with a radius of curvature (R) smaller than a design value that the wirings passing through the bending area BA can endure, the stress may be concentrated on part of the wiring corresponding to the radius of curvature smaller than the design value, thereby causing damage of the wiring. As a result, a structural defect may occur that the display panel 100 does not work properly.

Therefore, in order to protect the wirings of the bending area BA, it will be important to configure the flexible substrate 110 to have a certain radius of curvature R so as to prevent some of the wirings from being deformed due to additional external force.

Figure 4:
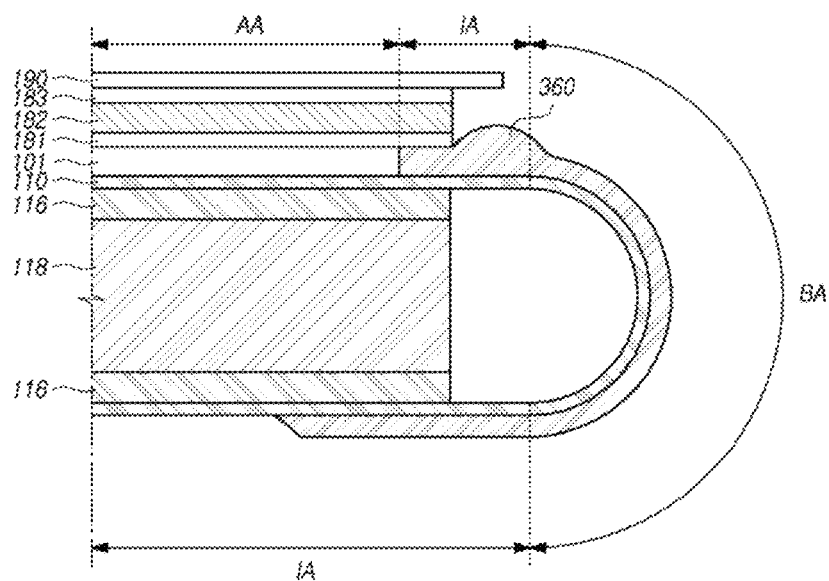
FIG. 4 shows an enlarged view of a bending area in which the cutting section of FIG. 2 is bent.

FIG. 4 is a cross-sectional view showing the structure when the bending of the display panel 100 has been completed. For convenience of illustration, in FIG. 4, the TFT array and the light emitting element formed on the flexible substrate 110 are indicated by a flat active area AA, and the encapsulation layer 170 may be of a threefold layer of e.g., an inorganic film/organic film/inorganic film covering the top surface of the active area AA and the side surface of the bending area BA, but the configuration of the encapsulation layer is not limited thereto.

A touch electrode layer 181 for recognizing touch and a first adhesive layer may be disposed in the active area AA. The touch electrode layer 181 may adopt, for example, an electrostatic touch or force touch method capable of sensing a touch pressure, or a pen touch method using a pen, although it is not limited thereto.

A polarization layer 182 may be disposed on the touch electrode layer 181 according to the aspect of the present disclosure. The polarization layer 182 may be adapted to minimize the influence that light generated from an external light source may enter the display panel 100 to affect the active area AA. The aspect of the present disclosure is not limited to the structure as disclosed in FIG. 4. For example, for any products very sensitive to the touch sensitivity, the touch electrode layer 181 and the polarization layer 182 may be disposed in a different order.

According to the exemplary aspect of the present disclosure, a second adhesive layer 183 may be disposed on the polarizing layer 182. A cover window 190 may be then attached to the outside of the display panel 100 to protect the display panel 100 from the external environment. The cover window 190 may be of a cover glass, a cover member, and the like, and it is not limited only to these terms.

A support layer 116 may be disposed underneath the flexible substrate 110 and a second touch electrode layer may be disposed underneath the support layer 116. The support layer 116 may be made of, for example, polyethylene terephthalate (PET), but it is not limited thereto. In the second touch electrode layer, a second sensor layer for the force touch sensing for sensing a touch pressure or an electromagnetic sensing touch for recognizing the touch by a pen may be disposed underneath the flexible substrate 110.

A metal layer may be further disposed beneath the support layer 116 or beneath the second touch electrode layer. Noise may be generated in batteries or semiconductor chips of the module to which the display panel 100 is attached, and the noise may cause electromagnetic interference (EMI) in the display panel 100. Then, such electromagnetic interference may cause a malfunction of the thin film transistor or the organic light emitting diode (OLED) of the active layer 101 or an abnormality of the display screen of the display panel. To prevent them, for example, a metal layer having a thickness of about 0.1 mm may be disposed, so that the electromagnetic interference (EMT) can be blocked. Alternatively, arranging the metal layer enables to have a heat dissipation effect dispersing heat generated from the light source of the display panel 100 as well as a strengthening effect capable of supporting the flexible substrate 110 more firmly.

An adhesive layer 118 may be disposed between the bent flexible substrate 110. The adhesive layer 118 may be disposed under the support layer 116 to maintain a bent shape of the flexible substrate 110. For example, the adhesive layer 118 may be a double-sided adhesive layer. For example, the double-sided adhesive layer may include a foam tape, a pressure sensitive adhesive, a foam-type adhesive, a liquid adhesive, a photo-curing adhesive, or any other suitable adhesive component. The adhesive layer 118 may be formed of or include a compressive material, and the compressive material may be a cushion for portions bonded to the adhesive layer 118. For example, the constituent material of the adhesive layer 118 may be compressible. The adhesive layer 118 may be made up of a plurality of layers including a cushion layer interposed between the upper layer and the lower layer of the adhesive material, for example, polyolefin foam. The adhesive layer 118 may be disposed on at least one of an upper surface and a lower surface of the extended body portion of the support layer 116.

The FPCB may be formed on the upper surface of the flexible substrate 110. As another example, the FPCB may be bent and connected to the pad 135 disposed on the opposite side of the active layer 101.

The micro coating layer 360 may be disposed to protect the wiring on the flexible substrate 110 and the like. For example, the micro coating layer 360 may be disposed across the entire bending area BA, for sufficient protection of the wiring, to start from the vicinity of the driver IC and come into contact with the bottom surface of the touch electrode layer 181 including the top surface of the active layer 101. A portion of the micro coating layer 360 may be disposed to contact or adjoin the side surface of the touch electrode layer 181 by over-coating at the end point of coating or by the surface tension between the touch electrode layer 181 and the micro coating layer 360. The micro coating layer 360 may be formed in the entire region extending from the adjacent area of the driver IC through the bending area BA to the active layer 101, and as described in FIG. 1, may be disposed along the notch 151 line formed over the inactive region IA and the bending area BA.

Figure 5:
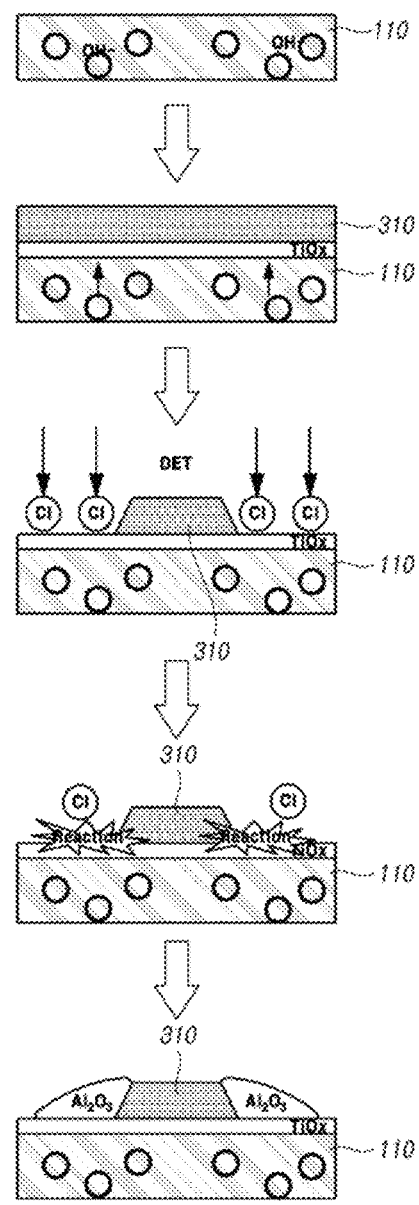
FIG. 5 schematically shows a sequence of stages in which the oxides are generated in the first wiring according to an exemplary aspect of the present disclosure.

FIG. 5 shows a sequence of steps in which oxides are produced in the first wiring 310. The flexible substrate 110 used as the substrate may use polyimide as described above. The polyimide contains a large amount of OH— fume in it, and the OH— fume can be released to the outside in the process of coating and curing for the flexible substrate 110. As described above, for maintaining a smooth bending process and its bending state, the wirings in the bending area BA may be formed by depositing a threefold layer of titanium-aluminum-titanium (Ti—Al—Ti), which is a metal for source-drain, without a separate inorganic insulating layer on the flexible substrate 110. For example, in order to form the first wiring 310 in the bending area BA, a source-drain wiring may be formed simultaneously with the active area AA on the flexible substrate 110, and through a photolithography process, photoresist coating, photolithography, and development processes may be performed so that a chain-shaped first wiring 310 remains. At this moment, a TiOx film may be formed between the flexible substrate 110 by a reaction of OH— fume released from the flexible substrate 110 and Ti component of titanium-aluminum-titanium (Ti—Al—Ti). When dry etching is performed to form a pattern of the first wiring 310, plasma chlorine gas (Cl) may be used. For example, the source-drain wiring and the photoresist may be removed to form a shape of the first wiring 310, for which a dry etching process may be performed. The dry etching process may be performed in such a way that chlorine gas (Cl gas) is made into plasma in a vacuum chamber and the plasma chlorine molecules is then accelerated onto the substrate to remove the source-drain wiring and the photoresist. The etching may be used in both wet etching and dry etching, but the dry etching will have an advantage of less impurities after the etching processing. When the first wiring 310 is patterned, TiOx already formed makes part of chlorine gas (Cl) remain on the surface of TiOx. Chlorine gas (Cl), moisture (H2O) in the atmosphere, and aluminum (Al) of the first wiring 310 react to generate hydrogen chloride (HCl) and aluminum oxide (Al2O3). It was confirmed that the reaction between aluminum and hydrogen chloride increased in a wide space between the wirings in the bending area BA. For example, it was confirmed that the larger the distance or space between the wirings is, the more the oxidation of the source-drain wiring increases. As such an interaction may continue, the generation of the aluminum oxide (Al2O3) around the first wiring 310 may increase, and the aluminum oxide (Al2O3) gradually grows to become a dark spot. When the growth of the dark spot continues, it may extend up to its neighboring first wiring 310 to often cause electrical short in the first wiring 310 or encroach on the first wiring 310 with the dark spot generated, so that the wiring may happen to lose its function or get disconnected.

Figure 6:
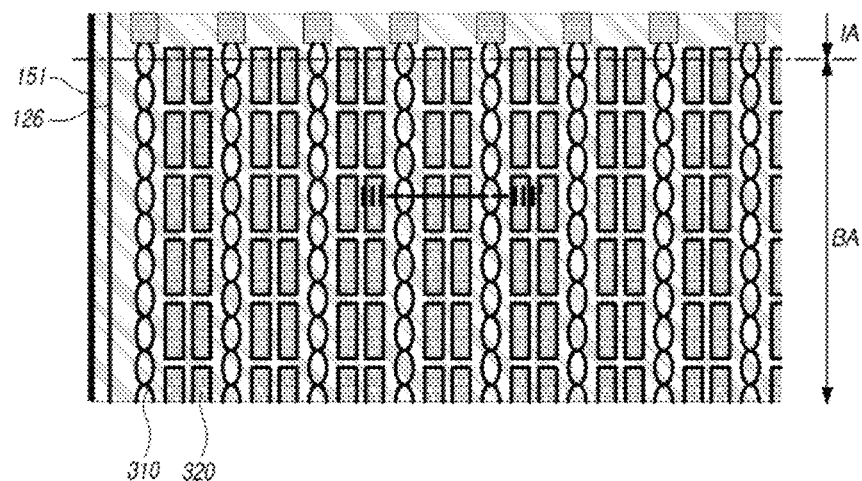
FIG. 6 shows an enlarged plan view of the wiring and its neighboring elements formed on a substrate in the bending area.

FIG. 6 shows a plan view of the portion at which the bending area of FIG. 4 begins. The low potential voltage wiring 126, the high potential voltage wiring 121, the gate power supply line 125, and the data wiring 127 may be arranged in the bending area BA, of which wirings the data wiring 127 is taken as an example. The reason why the data wiring 127 is taken as an example is that although various wirings may be arranged in the bending area BA, the data wiring 127 should be matched with the light emitting device 112 disposed in the active area AA, so the largest number of wirings have to be formed in bending area BA. The data wiring 127 should be formed in the bending area BA to transmit data signals from the driver IC to the array 111 and the light emitting device 112 in the active area AA. Hereinafter, it will be described considering the data wiring 127 disposed in the bending area BA as the first wiring 310. The first wiring 310 disposed in the bending area BA can improve the durability by designing the wirings in various shapes so as to withstand tensile stress and contraction stress. For example, the wirings may be formed of various shapes such as an elliptical chain shape as shown in FIG. 5, a rhombus chain shape, a shape with a hole formed in the center of a straight wiring, and the like. The present disclosure describes the elliptical chain shape illustrated in FIG. 5 as an example, but the shape of the wiring is not limited thereto. The first wirings 310 having a chain shape may be arranged to be spaced apart at a regular interval. For example, they may be disposed at a distance of about 100 µm, although not limited thereto. At least one dummy pattern 320 may be disposed in a space between the first wirings 310 to minimize an area exposed without the first wiring 310 on the flexible substrate 110. FIG. 6 illustrates that a plurality of two dummy patterns 320 in a rectangular shape are disposed, side by side, along the first wiring 310, but the arrangement is not limited thereto. Occurrence of oxidation in the first wiring 310 can be prevented by arranging the dummy patterns 320 in an interval or space between the first wirings 310 and its neighboring first wiring 310. Although it is described that the dummy pattern 320 has a rectangular shape as an example, a polygonal shape, a circular shape, or an elliptical chain shape same as the first wiring 310 would be also possible, but the shape is not limited thereto. In order to protect the first wiring 310, a crack stopper structure 126 may be disposed between the first wiring 310 and the notch 151 which is a cut surface of the substrate. Although FIG. 6 does not separately show any dummy pattern 320 outside the first wiring 310 disposed on the outermost side, an additional dummy pattern may be disposed between the crack stopper structure 126 and the first wiring 310. In the bending area BA, the first wiring 310 may have an elliptical chain shape, but when it extends to the inactive region IA, the first wiring 310 may have a straight structure. The shape of the wiring in the active region AA and the inactive region IA has a linear shape, but the shape of the wiring in the bending region BA may have an elliptical chain shape, a rhombus chain shape or zigzag form, etc. so as to withstand contraction stress and tensile stress. The present disclosure describes an example of the elliptical chain shape of wiring, but the shape of wiring is not limited thereto.

Figure 7:
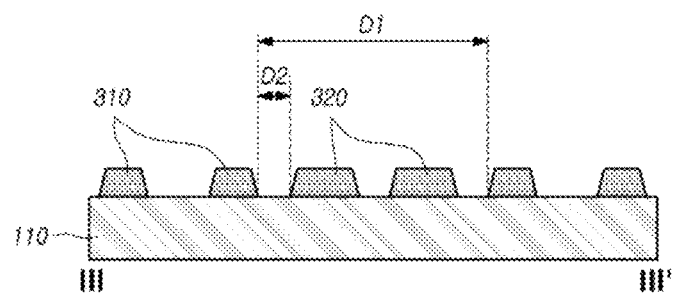
FIG. 7 is a cross-sectional view of the wirings taken along cutting line of FIG. 6.

FIG. 7 is a view showing a cross-section of cutting line in FIG. 6. The first wiring 310 and the dummy pattern 320 may be disposed on the flexible substrate 110 without a separate insulating layer. Although FIG. 7 shows two wirings 310 each having an elliptical chain-shaped cutting surface appear to be spaced apart from each other, they may be referred to as a connected structure when seeing the plan view of FIG. 6. Further, the dummy patterns 320 are disposed to be spaced apart from each other by a predetermined distance D2 from one end of the first wiring 310, between the first wirings 310. The first wiring 310 may be spaced apart from its neighboring first wiring 310 by a predetermined distance D1. In this aspect, the distance D1 between the first wirings 310 is assumed to be about 100 μm, but it is not limited thereto. In the aspect of the present disclosure, the distance D2 between the first wiring 310 and the dummy pattern 320 is assumed to be about 17 μm. The inventors of the present application have conducted various experiments to identify the condition that the first wiring 310 is not oxidized. For example, in order to reduce the area where the flexible substrate 110 of the bending area BA is exposed, an experiment was performed in which the dummy pattern 320 is disposed as close as possible to the first wiring 310. An experiment was conducted to apply various shapes of the dummy patterns 320 such as, for example, an elliptical chain shape or a zigzag shape, etc., so as to dispose the dummy patterns 320 closer to the first wiring 310, while considering the shape of the first wiring 310 in the bending area BA. It was then confirmed that when the distance D2 between the first wiring 310 and the dummy pattern 320 becomes less than 17 μm, an interaction may occur between the first wiring 310 and the dummy pattern 320, thereby generating corrosion in the first wiring 310. Further, it was also confirmed that when the distance D2 between the first wiring 310 and the dummy pattern 320 is gradually increased from 17 μm to 20 μm and further, up to 25 μm, the oxidation phenomenon between the first wiring 310 and the dummy pattern 320 increases. Accordingly, the dummy pattern 320 disposed between the first wire 310 and its neighboring other first wire 310 may be disposed to be spaced apart from each other by about 17 μm.

The display apparatus according to an exemplary aspect of the present disclosure may include a liquid crystal display device (LCD), a field emission display device (FED), and an organic light emitting display device (OLED), a quantum dot display device and the like.

The display apparatus according to an exemplary aspect of the present disclosure may be construed to include a set electronic apparatus, a set device or a set apparatus, such as a laptop computer as a complete product or a final product inclusive of a liquid crystal module (LCM), an OLED module or the like; a television; a computer monitor; an equipment display apparatus inclusive of an automotive display apparatus or a different form of vehicle; a mobile electronic apparatus such as a smartphone or an electronic pad, etc.

The display apparatus according to an exemplary aspect of the present disclosure may be described as follows.

The display apparatus according to an exemplary aspect of the present disclosure may include a flexible substrate having an active area and an inactive area, the inactive area including a first area adjacent to the active area, a second area in which a pad is disposed, and a bending area disposed between the first area and the second area, wherein a plurality of wirings extending from the second area to the first area may be disposed in the bending area, and a dummy pattern may be disposed between the plurality of wirings.

In the display apparatus according to an exemplary aspect of the present disclosure, at least two dummy patterns may be disposed, and the two dummy patterns may be spaced apart from the wiring at a regular interval.

In the display apparatus according to an exemplary aspect of the present disclosure, a plurality of wirings may be spaced apart from each other at a first interval, and at least two or more dummy patterns may be spaced at a second interval.

In the display apparatus according to an exemplary aspect of the present disclosure, the plurality of wirings disposed in the bending area may include a bending upper wiring and a bending lower wiring.

In the display apparatus according to an exemplary aspect of the present disclosure, the plurality of wirings and dummy patterns may have an extended form of an elliptical chain.

In the display apparatus according to an exemplary aspect of the present disclosure, the first interval may have a distance of at least 5 times the second interval.

In the display apparatus according to an exemplary aspect of the present disclosure, the bending area may further include a crack stopper structure in the vicinity of the outermost first wiring.

In the display apparatus according to an exemplary aspect of the present disclosure, the dummy pattern may be spaced apart from the first wiring by a second distance, and may extend to the first area and the second area along the first wiring.

The display apparatus according to an exemplary aspect of the present disclosure may further include a crack stopper structure adjacent to the bending upper wiring and the bending lower wiring disposed at the outermost part of the bending area.

In the display apparatus according to an exemplary aspect of the present disclosure, the cross-sectional width of a first wiring may be smaller than that of a contact portion.

In the display apparatus according to an exemplary aspect of the present disclosure, a first organic insulating layer may be disposed between the first wiring and a second wiring, and a second organic insulating layer and a micro coating layer may be disposed on the second wiring.

The display apparatus according to an exemplary aspect of the present disclosure may have at least one crack stopper structure adjacent to the first wiring and the second wiring disposed at the outermost part of the bending area.

What is claimed is:

1. A flexible display apparatus comprising:
   a flexible substrate having an active area and an inactive area, wherein the inactive area includes a first area adjacent to the active area, a second area in which a pad is disposed, and a bending area disposed between the first area and the second area;
   a data line, a portion of which extends across the inactive area and comprises a first sub-portion extending in a first direction and a second sub-portion extending in a second direction at a first predefined angle to the first direction;
   a low potential voltage line, a portion of which extends across the inactive area and comprises a first sub-portion extending in the first direction and a second sub-portion extending in a third direction at a second predefined angle to the first direction; and a high potential voltage line, a portion of which is located in the inactive area and extends in the third direction, wherein in the inactive area, the portion of the data line partially overlaps at least one of the portion of the low potential voltage line and the portion of the high potential voltage line.

2. The flexible display apparatus of claim 1, further comprising a dummy pattern disposed in the bending area, wherein the dummy pattern is disposed between a plurality of data line comprising the data line in the bending area.

3. The flexible display apparatus according to claim 2, wherein the dummy pattern comprises at least two dummy patterns spaced apart from the plurality of data lines.

4. The flexible display apparatus according to claim 3, wherein the plurality of data lines and the at least two dummy patterns have an extended elliptical chain.

5. The flexible display apparatus according to claim 3, wherein the plurality of data lines and the at least two dummy patterns include a same material.

6. The flexible display apparatus according to claim 3, wherein the at least two dummy patterns extend in a same direction as the plurality of data lines.

7. The flexible display apparatus according to claim 3, wherein the plurality of data lines are spaced apart from each other by a first interval, and the at least two dummy patterns are spaced apart from each other by a second interval.

8. The flexible display apparatus according to claim 7, wherein the first interval has a distance of at least 5 times the second interval.

9. The flexible display apparatus of claim 1, further comprising:
an electrostatic discharge circuit disposed in the first area of the inactive area; and
a gate-in-panel circuit disposed along an edge of the active area.

10. The flexible display apparatus of claim 9, wherein the electrostatic discharge circuit is disposed between bending area and the gate-in-panel circuit.

11. The flexible display apparatus of claim 9, further comprising a gate power line, a portion of which extends across the first area of the inactive area and comprises a first sub-portion extending in the third direction and a second sub-portion extending in a fourth direction at a third predefined angle to the first direction.

12. The flexible display apparatus of claim 11, wherein the gate power line overlaps the electrostatic discharge circuit.

13. The flexible display apparatus of claim 9, wherein the electrostatic discharge circuit is located in a place in which a first line along which the gate-in-panel circuit extends in the first direction and a second line along which the high potential voltage line extends in the third direction meet each other.

14. The flexible display apparatus of claim 1, wherein the flexible substrate comprises a polyimide resin-based material.

15. The flexible display apparatus of claim 1, further comprising a crack stopper disposed along an edge of the inactive area.

16. The flexible display apparatus of claim 15, further comprising a gate-in-panel circuit disposed along an edge of the active area, wherein a portion of the crack stopper disposed in the first area of the inactive area is located outside of the gate-in-panel circuit.

17. The flexible display apparatus of claim 1, wherein the portion of the high potential voltage line is located between the active area and the bending area.

18. The flexible display apparatus of claim 1, further comprising:
at least one insulating layer disposed over the flexible substrate; and
a coating layer disposed over the at least one insulating layer in the bending area.

19. The flexible display apparatus according to claim 1, wherein the data line disposed in the bending area includes a bending upper line and a bending lower line.

20. The flexible display apparatus according to claim 19, further comprising a crack stopper structure disposed adjacent to the bending upper line and the bending lower line disposed at an outermost portion of the bending area.

* * * * *